(12) United States Patent
Yamayoshi et al.

(10) Patent No.: US 9,733,530 B2
(45) Date of Patent: Aug. 15, 2017

(54) LIQUID CRYSTAL DISPLAY PANEL AND METHOD OF MANUFACTURING THE SAME

(71) Applicant: Mitsubishi Electric Corporation, Tokyo (JP)

(72) Inventors: Kazushi Yamayoshi, Kumamoto (JP); Naruhito Hoka, Tokyo (JP); Osamu Miyakawa, Kumamoto (JP); Shinsuke Ogata, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 55 days.

(21) Appl. No.: 14/826,909

(22) Filed: Aug. 14, 2015

(65) Prior Publication Data
US 2016/0062193 A1    Mar. 3, 2016

(30) Foreign Application Priority Data
Sep. 1, 2014    (JP) .................... 2014-176803

(51) Int. Cl.
| | | |
|---|---|---|
| *G02F 1/1362* | (2006.01) | |
| *G02F 1/1343* | (2006.01) | |
| *H01L 27/12* | (2006.01) | |
| *H01L 29/786* | (2006.01) | |
| *G02F 1/1345* | (2006.01) | |
| *G02F 1/1333* | (2006.01) | |

(52) U.S. Cl.
CPC .. *G02F 1/134309* (2013.01); *G02F 1/134363* (2013.01); *G02F 1/136227* (2013.01); *H01L 27/1288* (2013.01); *H01L 29/78636* (2013.01); *G02F 1/13458* (2013.01); *G02F 2001/133357* (2013.01); *G02F 2001/134372* (2013.01)

(58) Field of Classification Search
CPC . G02F 1/13454; G02F 1/13458; G02F 1/1339
See application file for complete search history.

(56) References Cited

U.S. PATENT DOCUMENTS

| | | | |
|---|---|---|---|
| 8,149,346 B2 | 4/2012 | Kimura | |
| 8,253,873 B2 * | 8/2012 | Sasaki ............... | G02F 1/134363 349/114 |
| 8,314,915 B2 | 11/2012 | Ota | |
| 8,917,370 B2 | 12/2014 | Ono | |
| 9,519,198 B2 * | 12/2016 | Nishiki ................ | G02F 1/1368 |

(Continued)

FOREIGN PATENT DOCUMENTS

| | | |
|---|---|---|
| JP | 2009-271389 A | 11/2009 |
| JP | 2010-008758 A | 1/2010 |
| JP | 2012-118199 A | 6/2012 |

*Primary Examiner* — Kendrick Hsu
(74) *Attorney, Agent, or Firm* — Studebaker & Brackett PC (57) ABSTRACT

The present invention includes a thin-film transistor, a flattened film having a flattened top surface and having a contact hole formed thereon, and a pixel electrode and a common line which are disposed on the top surface of the flattened film. The common line includes a common metal line, and the pixel electrode has a connection portion formed in the contact hole and electrically connected to the thin-film transistor. The connection portion of the pixel electrode includes a connection metal film made of the material same as the material for the common metal line of the common line.

8 Claims, 10 Drawing Sheets

(56) References Cited

U.S. PATENT DOCUMENTS

2014/0146262 A1* 5/2014 Yamayoshi ....... G02F 1/136227
                                                                349/43
2014/0211118 A1* 7/2014 Zhou ..................... H01L 27/124
                                                                349/43
2015/0070619 A1   3/2015 Ono
2015/0146128 A1   5/2015 Ono

* cited by examiner

LIQUID CRYSTAL DISPLAY PANEL AND METHOD OF MANUFACTURING THE SAME

BACKGROUND OF THE INVENTION

Field of the Invention

The present invention relates to a liquid crystal display panel of a liquid crystal display device, and method of manufacturing the same.

Description of the Background Art

A TN (Twisted Nematic) mode has been widely used as a display system of a liquid crystal display panel for a liquid crystal display device. Meanwhile, a transverse electric field system in which almost a horizontal electric field is generated on a liquid crystal display panel with an application of a voltage between a pixel electrode and a counter electrode to drive liquid crystal molecules in a horizontal direction is effective for increasing a viewing angle, attaining high definition, and increasing brightness. Therefore, this system has been becoming a mainstream in especially medium or small panels represented by smartphones or tablets.

It has been known that there are an IPS (In Plane Switching) (registered trademark) mode and an FFS (Fringe Field Switching) mode in the transverse electric-field system. In the FFS mode, a lower electrode and an upper electrode, which is provided on the lower electrode via an insulating film and has a slit, are provided, wherein one of them is used as a pixel electrode and the other one is used as a counter electrode. An electric field directs from the lower electrode to a liquid crystal above the lower and upper electrodes through the slit of the upper electrode, directs in the horizontal direction (transverse direction) in the liquid crystal, and then, directs to the upper electrode located below the liquid crystal. Thus, the liquid crystal is driven with the electric field in the horizontal direction.

When a display region of a liquid crystal display panel in the FFS mode is considered in a pixel unit, a thin-film transistor is formed on a layer below an upper electrode and a lower electrode via a protection insulating film. A voltage and an external arbitrary signal (voltage) are applied to the lower electrode or the upper electrode via the thin-film transistor and a contact hole formed on the protection insulating film from a signal line. In a pixel unit, a region actually used for a display (a region used for a display in a pixel unit is referred to as a "pixel display region" hereinafter) is a region where the upper electrode and the lower electrode are superimposed with each other, and a region where the thin-film transistor, contact hole, signal line, and a scanning line are disposed is a region not used for a display (hereinafter referred to as a "non-pixel display region"). An increase in a ratio of the non-pixel display region in the pixel unit decreases an aperture ratio of the pixel display region, and this hinders implementation of a high-definition liquid crystal display panel. Therefore, it is desirable that the non-pixel display region is made as small as possible for high definition.

In addition, parasitic capacitance that becomes a cause of deterioration in display quality occurs between the lower electrode and the signal line via the protection insulating film. For this reason, an insulating film for decreasing capacitance is used for a layer below the lower electrode. For example, an organic film having small dielectric constant and capable of being formed thick is used for an insulating film. Notably, Japanese Patent Application Laid-Open No. 2010-8758 describes the liquid crystal display panel described above.

The case where a lower electrode is specified as a pixel electrode and an upper electrode is specified as a counter electrode (hereinafter referred to as a "common electrode"), for example, will be described below. A transparent conductive film is used for both the pixel electrode and the common electrode, wherein a part of the pixel electrode serving as the lower electrode is electrically connected to a thin-film transistor via a contact hole on an organic film. Regardless of such structure, in general, a transparent conductive film having relatively large resistance is formed as a thin film, while an organic film is formed thick, so that a contact hole becomes deep. Therefore, when the transparent conductive film is not uniformly formed on the inner wall of the contact hole, a desired voltage is not applied to a liquid crystal, which might cause a display defect. At present, a size of a contact hole is increased to avoid this problem. However, this results in an increase in a non-pixel display region, which hinders an increase in an aperture ratio.

In addition, the common electrode and a common line electrically connected thereto are formed on the whole display region of the liquid crystal display panel. Therefore, in a conventional structure in which they are made of a transparent conductive film having relatively large resistance, a voltage cannot uniformly be applied to the whole display region, so that a problem of an occurrence of a display defect arises.

SUMMARY OF THE INVENTION

The present invention is accomplished in view of the above problem, and aims to provide a technique capable of preventing an occurrence of a display defect.

A liquid crystal display panel according to the present invention includes: a thin-film transistor electrically connected to lines including a scanning line; a flattened film formed on the thin-film transistor and having a flattened top surface and a contact hole formed thereon; a lower electrode disposed on the top surface of the flattened film; an upper electrode disposed on the lower electrode via an insulating film and having a plurality of slit-like openings, the upper electrode being capable of generating an electric field for driving a liquid crystal with the lower electrode; and a common lines disposed on the top surface of the flattened film as overlapped with the scanning line in a plan view and is electrically connected to one of the lower electrode and the upper electrode. The common line includes a metal line; the lower electrode has a flat-plate electrode portion disposed on the top surface of the flattened film and made of a transparent conductive film, and a connection portion formed in the contact hole of the flattened film and electrically connected to the thin-film transistor; and the connection portion of the lower electrode includes a metal member made of a material same as the material of the metal line in the common line.

The liquid crystal display panel can reduce resistance of the connection portion and the common line, thereby being capable of preventing an occurrence of a display defect.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5A to 11B are sectional views each illustrating a method of manufacturing the liquid crystal display panel according to the preferred embodiment.

DESCRIPTION OF THE PREFERRED EMBODIMENT

Figure 1:
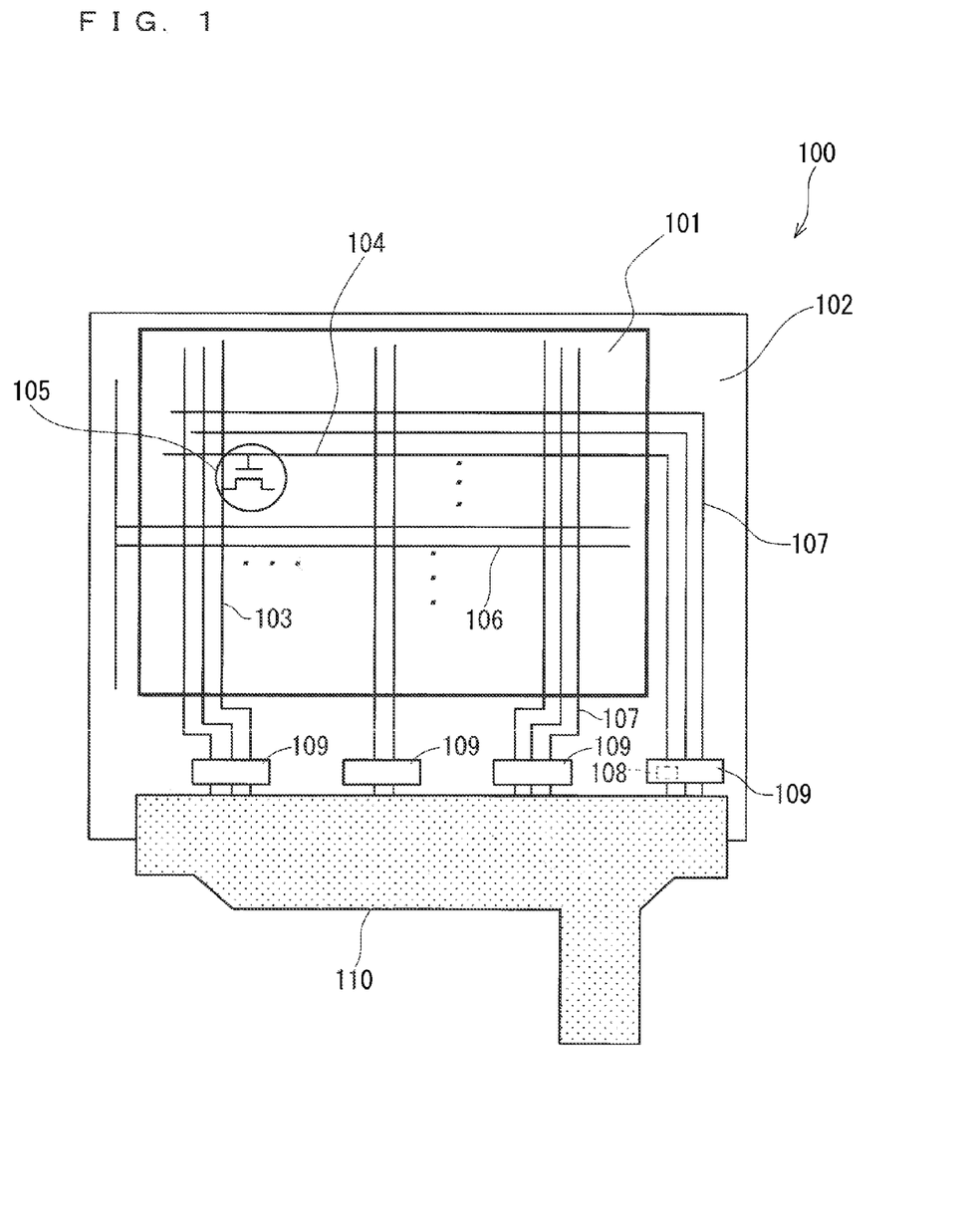
FIG. 1 is a plan view illustrating a configuration of a liquid crystal display panel according to a preferred embodiment.
Figure 2:
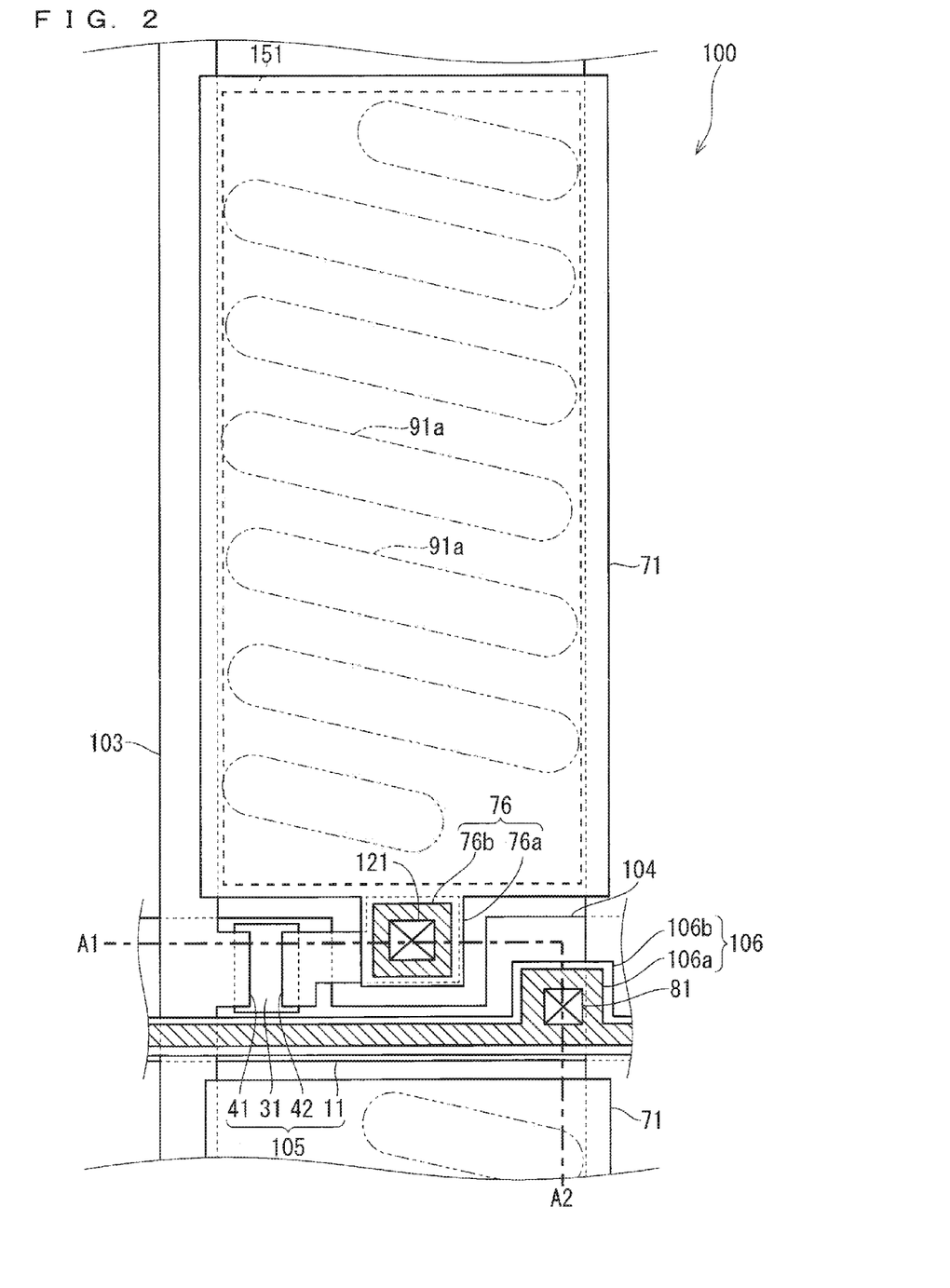
FIG. 2 is a plan view illustrating a configuration of one pixel of the liquid crystal display panel according to the preferred embodiment.

First, the case where the present invention is applied to a general liquid crystal display panel of an FFS mode will be described as one example of a preferred embodiment of the present invention. FIG. 1 is a plan view illustrating a configuration of a liquid crystal display panel according to the present preferred embodiment. FIG. 1 and subsequent drawings are schematic, and they do not reflect precise sizes of the illustrated components. For avoiding complexity of drawings, components other than essential parts of the invention are omitted, or the configuration is partly simplified, as necessary. In FIG. 2 and subsequent drawings, the components same as those described with reference to FIG. 1 are identified by the same reference numerals, and their description will be omitted.

As illustrated in FIG. 1, the liquid crystal display panel of an FFS mode includes a display region 101 for displaying an image and a frame region 102 adjacent to the display region 101. These regions are provided on a transparent insulating substrate 100. As one example, the frame region 102 surrounds the display region 101. The liquid crystal display panel also includes a color filter substrate disposed opposite to the transparent insulating substrate 100, and a liquid crystal layer disposed in at least the display region 101 between the transparent insulating substrate 100 and the color filter substrate (they are not illustrated in the figure), in addition to the transparent insulating substrate 100. The color filter substrate may be the one generally used for a liquid crystal display panel of an FFS mode, so that its detailed description will be omitted.

The liquid crystal display panel includes a plurality of external lines 107, a plurality of terminal electrodes 108, and a plurality of IC (Integrated Circuit) chips 109 in the frame region 102. Notably, FIG. 1 illustrates only one terminal electrode 108 for convenience.

The external lines 107 are those extending from the signal lines 103 and the scanning lines 104 in the display region 101 to the frame region 102. Each of the terminal electrodes 108 is electrically connected to an end of the external line 107, and disposed such that the area of the terminal electrode 108 increases. The terminal electrode 108 disposed in the frame region 102 is a terminal for an external connection. In the present preferred embodiment, the terminal electrode 108 is electrically connected to an external member such as the IC chip 109 or a print substrate 110.

It is to be noted that a terminal electrode similar to the terminal electrode 108 and an external line similar to the external line 107 are also disposed at the portion overlapped with the IC chip 109 and a portion closer to an end from the IC chip 109 on the transparent insulating substrate 100. The terminal at the side of the IC chip 109 is electrically connected to the surface of the terminal electrode 108 via a bump or an ACF (Anisotropic Conductive Film). Similarly, the print substrate 110 is also electrically connected to the surface of the terminal electrode similar to the terminal electrode 108 via a bump or an ACF.

In the display region 101, the liquid crystal display panel includes a plurality of signal lines 103, a plurality of scanning lines 104, a plurality of thin-film transistors 105 electrically connected to these lines, and a plurality of common lines 106.

The plurality of signal lines 103 and the plurality of scanning lines 104 are disposed to be mutually orthogonal. One pixel is formed in a region enclosed by the adjacent signal line 103 and the adjacent scanning line 104. A plurality of pixels is arrayed in a matrix. In the present preferred embodiment, each of the plurality of thin-film transistors 105 is provided to correspond to each of the plurality of pixels, and is arrayed in a matrix.

Figure 3:
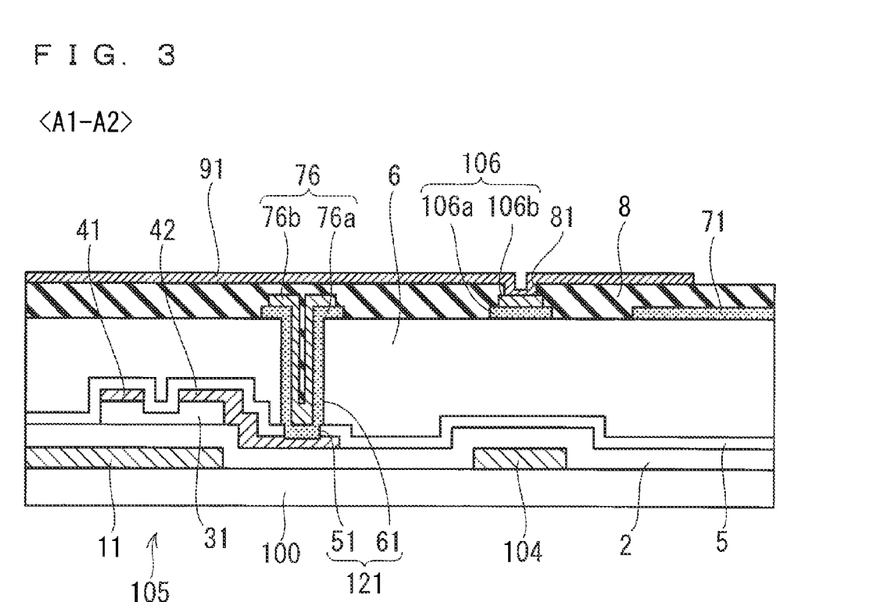
FIG. 3 is a sectional view illustrating a configuration of one pixel of the liquid crystal display panel according to the preferred embodiment.

FIG. 2 is an enlarged plan view illustrating the configuration of the liquid crystal display panel for one pixel formed in the display region 101 in FIG. 1 according to the present preferred embodiment. FIG. 3 is a sectional view illustrating the configuration of the liquid crystal display panel taken along a line A1-A2 in FIG. 2 according to the present preferred embodiment.

In each pixel, the liquid crystal display panel includes not only the above components such as the thin-film transistor 105 but also a protection insulating film 5, a flattened film 6, a pixel electrode 71 serving as a lower electrode, the common line 106, an interlayer insulating film 8 that is an insulating film, and a common electrode 91 serving as an upper electrode. The above-described thin-film transistor 105 includes a gate electrode 11, a gate insulating film 2, a semiconductor film 31, a source electrode 41, and a drain electrode 42.

Firstly, an outline of the configuration and operation of the liquid crystal display panel for a pixel unit will be described. The pixel electrode 71 made of a transparent conductive film and having a plate electrode portion, and the common electrode 91 made of a transparent conductive film and having a plurality of slits 91a that are slit-like openings are disposed in each pixel so as to be overlapped with each other in a plan view. When a voltage is applied between the pixel electrode 71 and the common electrode 91, a fringe electric field is generated between these electrodes. The fringe electric field is an electric field that is emitted from the pixel electrode 71 to move upward through the opening portion of the slit 91a of the common electrode 91, moves in the horizontal direction (transverse direction) in a liquid crystal layer disposed above the common electrode 91, and then, moves to the common electrode 91 located below the liquid crystal layer. The fringe electric field includes an electric field almost horizontal to the transparent insulating substrate 100 as described here. With this horizontal electric field, liquid crystal molecules in the liquid crystal layer are driven in the horizontal direction. According to this, a polarizing direction of light passing through the liquid crystal molecules is appropriately changed for each pixel, whereby a desired display can be implemented in the display region 101. A region indicated by a broken line in FIG. 2 where the pixel electrode 71 and the common electrode 91 are overlapped with each other is a region used for a display for a pixel unit. In other words, this region is a pixel display region 151. The pixel display region 151 corresponds to an opening portion formed on a light-shielding film (black matrix) for a pixel unit in a plan view, the light-shielding film being disposed on a color filter substrate disposed opposite to the transparent insulating substrate 100 via the liquid crystal layer.

The thin-film transistor 105 serving as a switching element for controlling on/off for a supply of a display voltage is disposed below the pixel electrode 71 and the common electrode 91 and is disposed on the transparent insulating substrate 100, in order to selectively apply a voltage based on signal data externally inputted to the pixel electrode 71 to the plurality of pixels.

As illustrated in FIG. 2, the gate electrode 11 of the thin-film transistor 105 is connected to the scanning line 104, and the source electrode 41 is connected to the signal line 103. As illustrated in FIGS. 2 and 3, the drain electrode 42 is connected to a connection portion 76 of the pixel electrode 71 via a contact hole 121. As illustrated in FIG. 2, especially a common metal line 106b, which is a light-shielding region, of the common line 106 is disposed to be overlapped with the scanning line 104 in a plan view. As illustrated in FIGS. 2 and 3, the common line 106 is connected to the common electrode 91 via a contact hole 81.

When a signal is supplied to the gate electrode 11 from the scanning line 104, the thin-film transistor 105 transmits a current (signal data) from the source electrode 41 connected to the signal line 103 to the drain electrode 42 connected to the pixel electrode 71. Specifically, a voltage based on the signal data supplied from the signal line 103 is applied to the pixel electrode 71.

The signal data is controlled by the IC chip 109 or the print substrate 110 connected to the terminal electrode 108. Therefore, when display data is externally inputted to the IC chip 109 or the print substrate 110, signal data (voltage) according to the display data is supplied to the pixel electrode 71 of each pixel.

Next, the configuration of the pixel will be described with reference mainly to FIG. 3.

The gate electrode 11 is disposed on a region where the thin-film transistor 105 is to be formed on the transparent insulating substrate 100 in the display region 101. The scanning line 104 extending from the gate electrode 11 is also disposed on the transparent insulating substrate 100. The gate insulating film 2 is formed to cover the gate electrode 11 and the scanning line 104. An SiN film is used for the gate insulating film 2, for example.

An island-shaped semiconductor film 31 is formed on the gate electrode 11 via the gate insulating film 2. Any one of amorphous, microcrystalline silicon, and polycrystalline silicon; a silicon semiconductor formed by stacking these materials; or an oxide semiconductor is used as a material for the semiconductor film 31. The source electrode 41 and the drain electrode 42 are mounted so as to be in contact with a source region and a drain region respectively across a channel region of the semiconductor film 31. In this way, the thin-film transistor 105 is formed.

The signal line 103 extending from the source electrode 41 is formed on the gate insulating film 2. With the configuration described above, the thin-film transistor 105 is electrically connected to lines including the signal line 103, the scanning line 104, and the external line 107 formed by extending these lines, for example. The thin-film transistor 105 is thus electrically connected to the terminal electrode 108 through the lines (signal line 103, scanning line 104, and external line 107).

The protection insulating film 5 is provided between the lines (signal line 103, scanning line 104, and external line 107) or the thin-film transistor 105 and the later-described flattened film 6. A contact hole 51 communicating with a contact hole 61 formed on the flattened film 6 is formed on the protection insulating film 5. The contact hole 51 on the protection insulating film 5 and the contact hole 61 on the flattened film 6 form the above-described contact hole 121.

An inorganic insulating film such as an SiN film or a silicon oxide film (SiO film) is used as the material of the protection insulating film 5. When an inorganic insulating film such as an SiN film is used for the protection insulating film 5, deterioration in characteristics of the thin-film transistor 105 due to moisture from the flattened film 6 can be suppressed. Besides, this configuration can also provide an effect such that an external damage is difficult to be generated, since an inorganic insulating film has mechanical strength.

The flattened film 6 is provided on the thin-film transistor 105 via the protection insulating film 5. The flattened film 6 has a flattened top surface, and has the contact hole 61 formed thereon. An organic resin may be used as the material of the flattened film 6, for example. An organic resin has excellent flatness. Therefore, when an organic resin is used for the flattened film 6, a step (height difference) of the structure such as the thin-film transistor 105 under the flattened film 6 is difficult to be reflected on the top surface of the flattened film 6. With this, the pixel electrode 71 and the common electrode 91 can be formed on a flat plane.

Alternatively, an organic resin mainly made of acryl or SOG (Spin On Glass) may be used for the flattened film 6, for example. A permittivity ϵ of an acryl resin or an SOG film is 3 to 4 which is lower than a permittivity (6 to 7) of an SiN film. Therefore, when an acryl resin or SOG film is used for the flattened film 6, a parasitic capacitance between the signal line 103 and the lower electrode (pixel electrode 71) can be reduced. This can consequently suppress an influence of noise from the signal line 103 to the pixel electrode 71, thereby being capable of suppressing deterioration in display quality. Considering only the suppression of the noise influence, an SiO film having a permittivity ϵ almost equal to that of the SOG film can be used for the flattened film 6. However, the SiO film is a little difficult to be flattened, similar to the SiN film.

Alternatively, an organic resin having photosensitivity may be used as the material of the flattened film 6, for example. When an organic resin having photosensitivity is used for the flattened film 6, an opening having a desired pattern can be formed on the flattened film 6 with relatively easy photolithography. With this, the contact hole 61 having a desired pattern can be formed on the flattened film 6 on the drain electrode 42. A dry etching using the flattened film 6 as an etching mask is then performed, whereby the contact hole 51 can be formed on the protection insulating film 5. Specifically, an opening can be formed on the protection insulating film 5 at the opening portion of the flattened film 6 with the dry etching.

The patterned pixel electrode 71 and the common line 106 are disposed on the flattened top surface of the flattened film 6 so as to be apart from each other.

The pixel electrode 71 has the connection portion 76 disposed in the contact hole 121 (the contact hole 61 of the flattened film 6) and electrically connected to the drain electrode 42 of the thin-film transistor 105. Although the pixel electrode 71 and the connection portion 76 are illustrated as being separated from each other in FIG. 3, the connection portion 76 is a part of the pixel electrode 71 as illustrated in FIG. 2.

The connection portion 76 of the pixel electrode 71 includes a connection transparent conductive film 76a (second transparent conductive film) and a connection metal film 76b (metal member). The connection transparent conductive film 76a is formed between the connection metal film 76b and an inner wall of the contact hole 121 (flattened film 6). In other words, the connection portion 76 is formed by stacking the connection metal film 76b on the connection transparent conductive film 76a. IZO (Indium Zinc Oxide) or ITO (Indium Tin Oxide) is used as a material of the connection transparent conductive film 76a, for example. As illustrated in FIG. 3, the connection transparent conductive film 76a and the connection metal film 76b may be formed on the periphery of the contact hole 121 (contact hole 61) on the top surface of the flattened film 6 as well as the inside of the contact hole 121 (contact hole 61).

The portion other than the connection portion 76 of the pixel electrode 71 includes a flat-plate electrode portion, which is formed on the flattened top surface of the flattened film 6 and made of a transparent conductive film, without including the connection metal film 76b. The material same as the material of the transparent conductive film for the connection transparent conductive film 76a is used for the transparent conductive film for the flat-plate electrode portion, for example.

The connection transparent conductive film 76a is formed on the inner wall of the contact hole 121 that is almost perpendicular to the transparent insulating substrate 100. Such portion generally has poor coating performance upon a film formation. Therefore, this portion has a thickness smaller than the desired thickness of the pixel electrode 71. In addition, the transparent conductive film made of IZO or ITO has relatively high resistance. Accordingly, if the connection portion 76 includes only the connection transparent conductive film 76a, and the connection transparent conductive film 76a is not uniformly formed, a normal voltage (for example, a voltage determined upon design) is not applied to the pixel electrode 71, which entails a display defect.

On the other hand, the connection portion 76 in the liquid crystal display panel according to the present preferred embodiment includes not only the connection transparent conductive film 76a but also the connection metal film 76b. This configuration can sufficiently reduce resistance at the connection portion 76. Consequently, a display defect can be suppressed or the ratio of the non-pixel display region to the pixel display region can be decreased by reducing the size of the contact hole 121.

Next, the common line 106 formed on the top surface of the flattened film 6, similar to the pixel electrode 71, will be described.

As described above, the common line 106 is disposed on the top surface of the flattened film 6 as overlapped with the scanning line 104 in a plan view. In the present preferred embodiment, the common line 106 is electrically connected to the upper electrode to allow the upper electrode to be used as the common electrode 91. However, the configuration is not limited thereto as described later.

The common line 106 includes a common transparent conductive film 106a (first transparent conductive film) and a common metal line 106b (metal line). The common transparent conductive film 106a is provided between the common metal line 106b and the flattened film 6. In other words, the common line 106 is formed by stacking the common metal line 106b on the common transparent conductive film 106a. IZO or ITO is used as a material of the common transparent conductive film 106a, for example. The common metal line 106b of the common line 106 and the connection metal film 76b of the connection portion 76 are made of the same material.

The common line 106 configured as described above includes not only the common transparent conductive film 106a but also the common metal line 106b, whereby the reduction in resistance of the common line 106 can be implemented. As described above, especially the common metal line 106b, which is a light-shielding region, of the common line 106 is disposed to be overlapped with the scanning line 104. With this configuration, it is unnecessary to form a new non-pixel display region to the common line 106, and this can decrease the ratio of the non-pixel display region.

The interlayer insulating film 8 provided with the contact hole 81 is formed on the above-described pixel electrode 71 and the common line 106.

The common electrode 91 is provided on the pixel electrode 71 via the interlayer insulating film 8 (insulating film). Specifically, the common electrode 91 is overlapped with the pixel electrode 71. The common electrode 91 is electrically connected to the common line 106 through the contact hole 81 on the interlayer insulating film 8, and has slits 91a (FIG. 2) formed thereon. The common electrode 91 configured as described above can generate an electric field (fringe electric field) for driving liquid crystals with the pixel electrode 71. A transparent conductive film made of IZO or ITO is used for the common electrode 91, for example.

Figure 4:
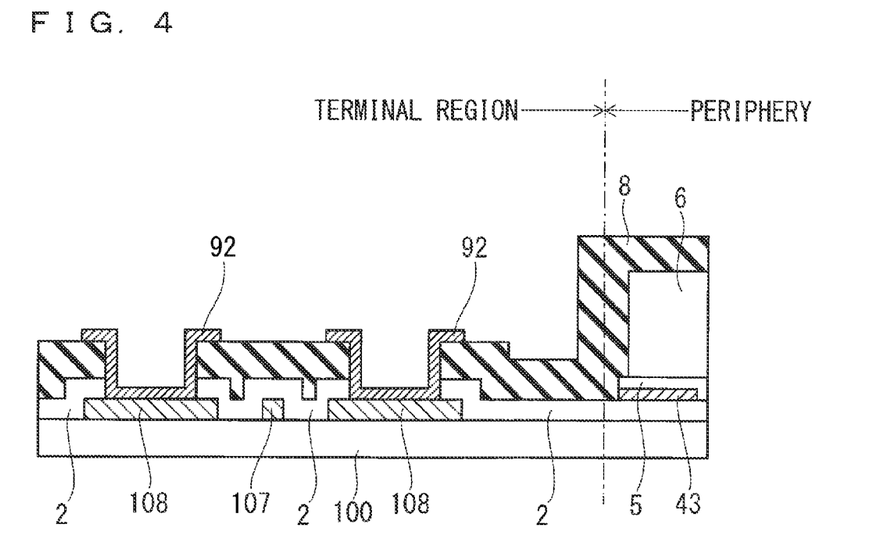
FIG. 4 is a sectional view illustrating a configuration of a part of the liquid crystal display panel according to the preferred embodiment.

The configuration of the display region 101 has been described above. Next, configurations of a terminal region where the terminal electrode 108 is formed and its peripheral region on the frame region 102 will be described below. FIG. 4 is a sectional view illustrating the configuration of the liquid crystal display panel in the frame region 102 (the terminal region and its peripheral region).

Similar to the display region 101, the frame region 102 is also formed on the transparent insulating substrate 100. The elements in the frame region 102 are made of the materials same as the elements on the same layers in the display region 101. For example, the external line 107 and the terminal electrode 108 extending from the external line 107 are made of the materials same as the gate electrode 11 and the scanning line 104 which are the elements on the same layer.

The gate insulating film 2 is formed to cover the external line 107 and the transparent insulating substrate 100 except for the portion above the terminal electrode 108 in the terminal region and its peripheral region. The interlayer insulating film 8 is formed on the gate insulating film 2 in the terminal region and a part of its peripheral region.

A remnant of a stopper metal film 43 used as an etch stopper in a dry etching for the protection insulating film 5, the protection insulating film 5, the flattened film 6, and the interlayer insulating film 8 are provided in this order on the gate insulating film 2 in other part of the peripheral region of the terminal region. The stopper metal film 43 is the element on the same layer of the source electrode 41, the drain electrode 42, and the signal line 103, and is provided between the gate insulating film 2 and the protection insulating film 5.

A terminal transparent conductive film 92 is formed on the terminal electrode 108 in the opening formed on the gate insulating film 2 and the interlayer insulating film 8. This terminal transparent conductive film 92 is an element on the same layer of the common electrode 91, and is made of a material such as IZO or ITO.

In the liquid crystal display panel according to the present preferred embodiment, the flattened file 6 is not formed above the external line 107 (wiring) in the frame region 102 (such as the terminal region). This can prevent a step on the surface around the terminal electrode 108 in the frame region 102 (such as the terminal region). With this configuration, conductive particles such as bumps or ACF can easily be pressure-bonded to the surface of the terminal electrode 108, whereby conductive defect (contact defect) between the external line 107 and the IC chip 109 or the print substrate 110 can be prevented. This can suppress conductive defect (contact defect) even if the space between the terminal electrodes 108 is small.

<Manufacturing Method>

FIGS. 5A to 11B are sectional views each illustrating a manufacturing method according to the present preferred embodiment. The manufacturing method according to the present preferred embodiment will be described below with reference to FIGS. 5A to 11B. FIGS. 5A, 6A, 7A, 8A, 9A, 10A, and 11A illustrate the configuration of the display region 101, while FIGS. 5B, 6B, 7B, 8B, 9B, 10B, and 11B illustrate the configuration of the terminal region (frame region 102). As apparent from the description below, a photolithography process is performed seven times in the manufacturing method according to the present preferred embodiment.

Firstly, a first metal film is formed on the transparent insulating substrate 100 such as a glass substrate with a sputtering method. Examples of the usable materials for the first metal film include aluminum (Al) or its alloy, or an alloy of molybdenum (Mo), chrome (Cr) or copper (Cu).

A photoresist that is a photosensitive resin is applied on the first metal film with spin coating or the like. Then, a first photolithography process (photoengraving process) in which the applied photoresist is exposed and developed to be patterned into a desired shape is performed. An etching is performed by using the photoresist after the first photolithography process as an etching mask, whereby the first metal film is patterned into a desired shape. Then, the photoresist is peeled.

Figure 5A:
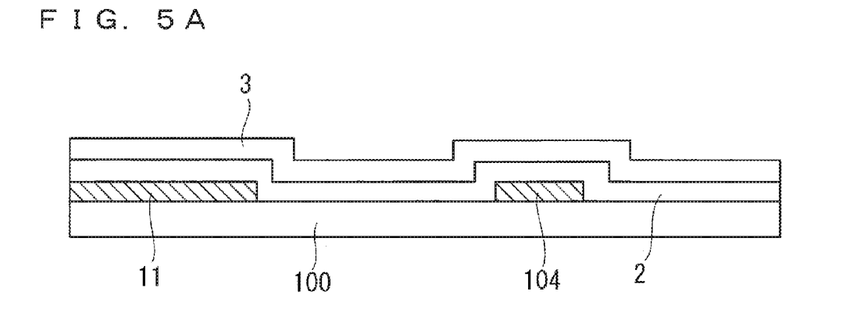
Figure 5B:
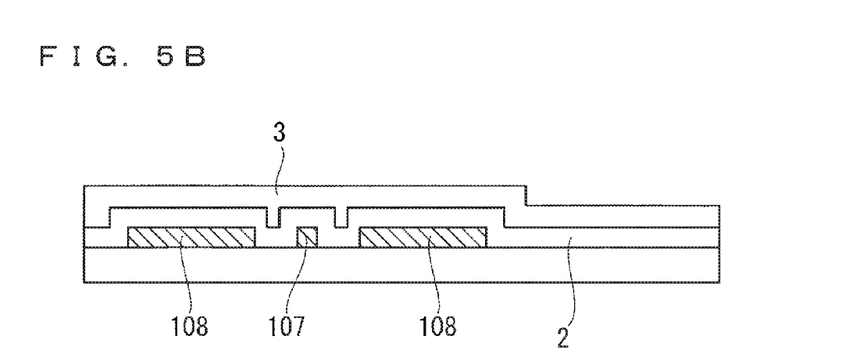

With the first photolithography process, the gate electrode 11 of the thin-film transistor 105 and the scanning line 104 are formed from the first metal film in the display region 101 as illustrated in FIG. 5A. As illustrated in FIG. 5B, the terminal electrode 108 is formed from the first metal film in the terminal region. In the display region 101 and the terminal region, the external line 107 extending from the scanning line 104 to the frame region 102 is formed from the first metal film. Next, the gate insulating film 2 and the semiconductor film 3 are sequentially and continuously formed on these lines and the transparent insulating substrate 100 with a plasma CVD (Chemical Vapor Deposition) method. An SiN film is used for the gate insulating film 2, for example.

With the process described above, the structure illustrated in FIGS. 5A and 5B is obtained.

Figure 6A:
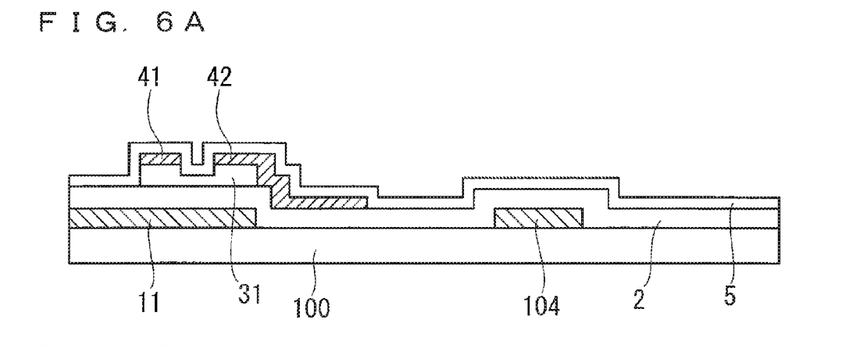

Next, the semiconductor film 3 is patterned with a second photolithography process or an etching so as to form the source region, the channel region, and the drain region of the thin-film transistor 105. With this process, the island-shaped semiconductor film 31 is formed from the semiconductor film 3 in the display region 101 as illustrated in FIG. 6A.

Then, a second metal film is formed with a sputtering method. Examples of the usable materials for the second metal film include aluminum (Al) or its alloy, or an alloy of molybdenum (Mo), chrome (Cr) or copper (Cu).

Figure 6B:
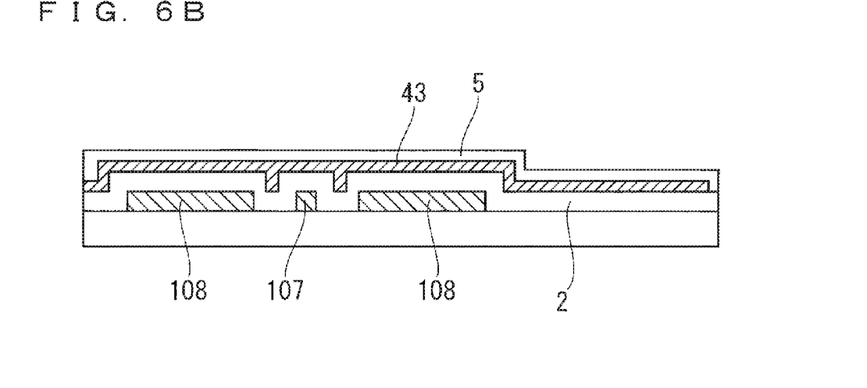

Next, the second metal film is patterned into a desired shape with a third photolithography process and an etching. With this process, the source electrode 41 in contact with the source region of the thin-film transistor 105, the drain electrode 42 in contact with the drain region, and the signal line 103 are formed from the second metal film in the display region 101 as illustrated in FIG. 6A. The stopper metal film 43 is formed from the second metal film in the terminal region and its peripheral region as illustrated in FIG. 6B. In the display region 101 and the terminal region, the external line 107 extending from the signal line 103 to the frame region 102 is formed from the second metal film. Thereafter, the protection insulating film 5 made of an SiN film, for example, is formed to cover these elements with a plasma CVD method.

With the process described above, the structure illustrated in FIGS. 6A and 6B is obtained.

Figure 7A:
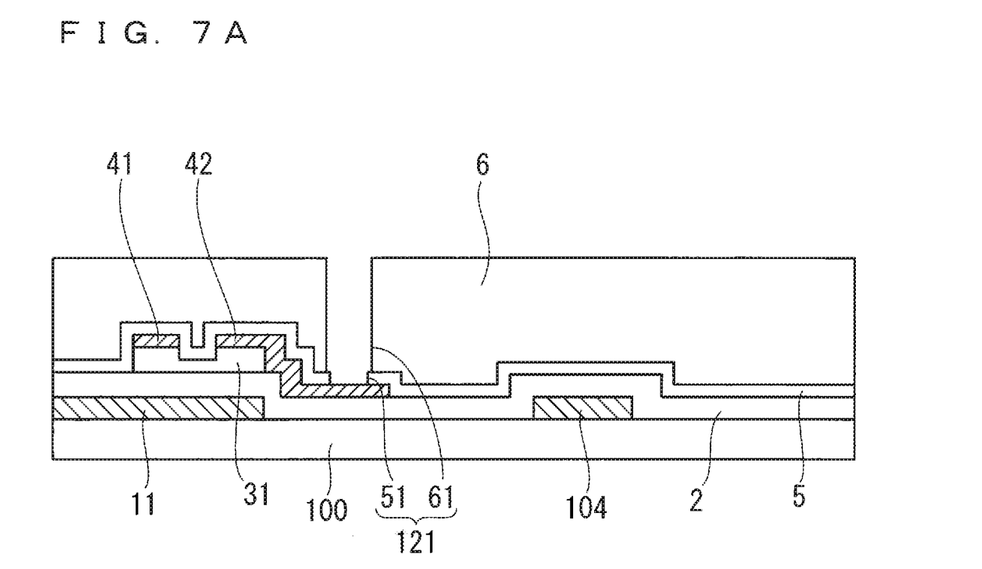
Figure 7B:
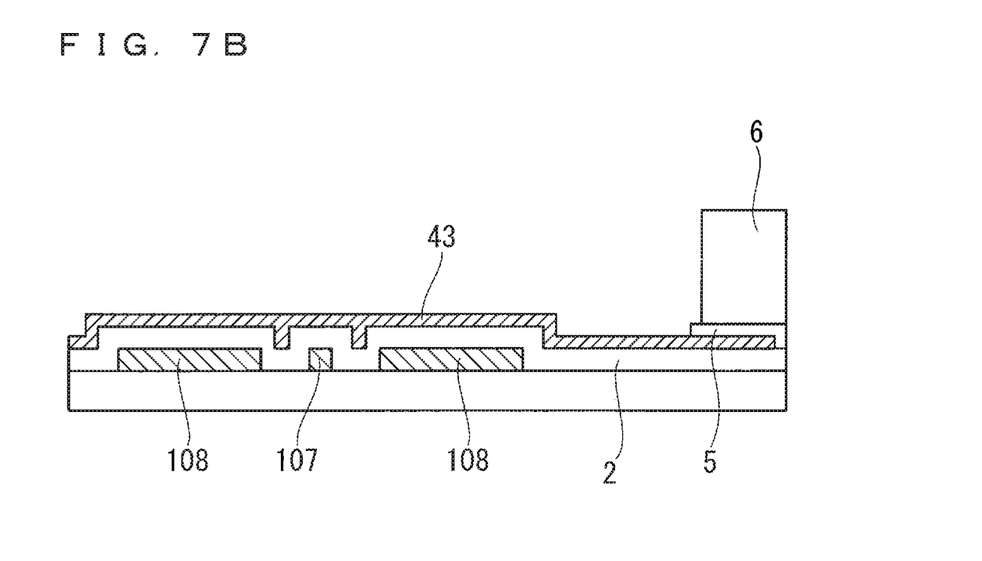

Next, an organic resin film having photosensitivity is applied with spin coating or the like to have a thickness of 2 μm~4 μm. Then, the organic resin film is exposed and developed with a fourth photolithography process. As illustrated in FIGS. 7A and 7B, the flattened film 6 having the contact hole 61 is formed from the organic resin film, and the organic resin film in the terminal region and its peripheral region is removed with the fourth photolithography process.

With the process so far, the thin-film transistor 105, the lines (the signal line 103, the scanning line 104, and the external line 107), and the stopper metal film 43 are formed, the protection insulating film 5 is formed thereon, and the flattened film 6 having the contact hole 61 is formed on the protection insulating film 5.

Next, the protection insulating film 5 is selectively dry-etched by using the flattened film 6 as an etching mask. With this process, the protection insulating film 5 below the contact hole 61 is removed to form the contact hole 51 in the display region 101 as illustrated in FIG. 7A. The protection insulating film 5 is completely removed in the terminal region as illustrated in FIG. 7B. Here, the drain electrode 42 of the thin-film transistor 105 and the stopper metal film 43 function as an etching stopper of the dry etching for the protection insulating film 5.

Specifically, the protection insulating film 5 exposed from the flattened film 6 is removed with the dry etching using the drain electrode 42 and the stopper metal film 43 as an etch stopper. This process can suppress an influence of the dry etching for the protection insulating film 5 to the structure below the drain electrode 42 and the stopper metal film 43. Although not illustrated here, the gate insulating film 2 is etched as well as the protection insulating film 5 on the portion where the drain electrode 42 or the stopper metal film 43 is not formed in the opening of the flattened film 6.

With the process described above, the structure illustrated in FIGS. 7A and 7B is obtained.

Figure 8A:
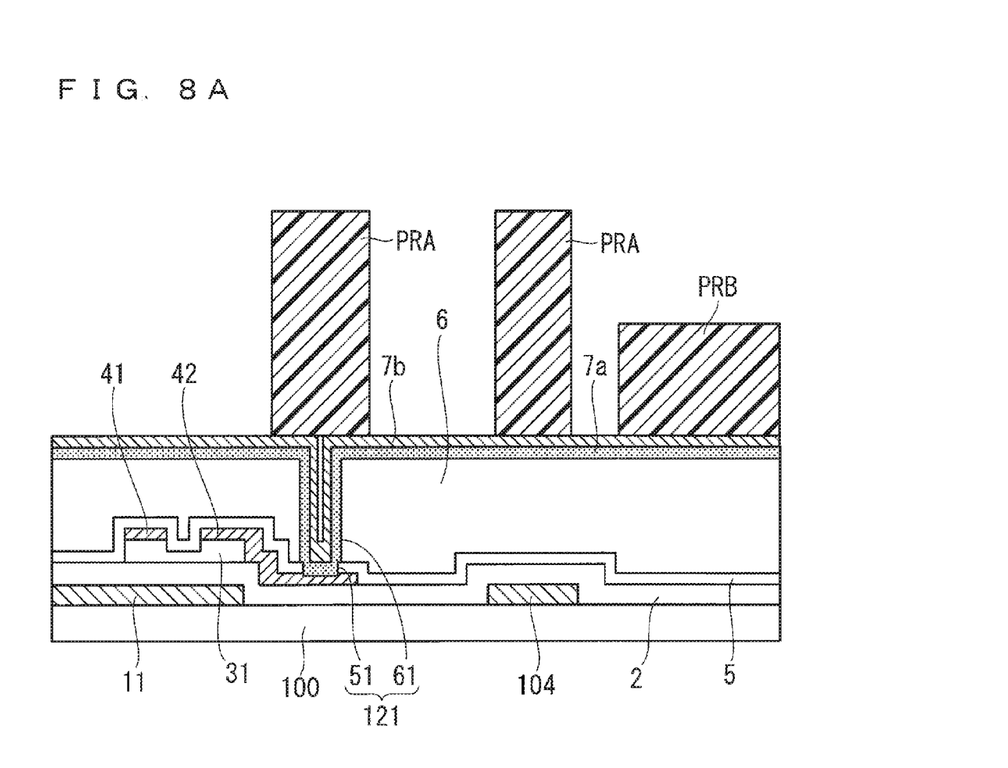
Figure 8B:
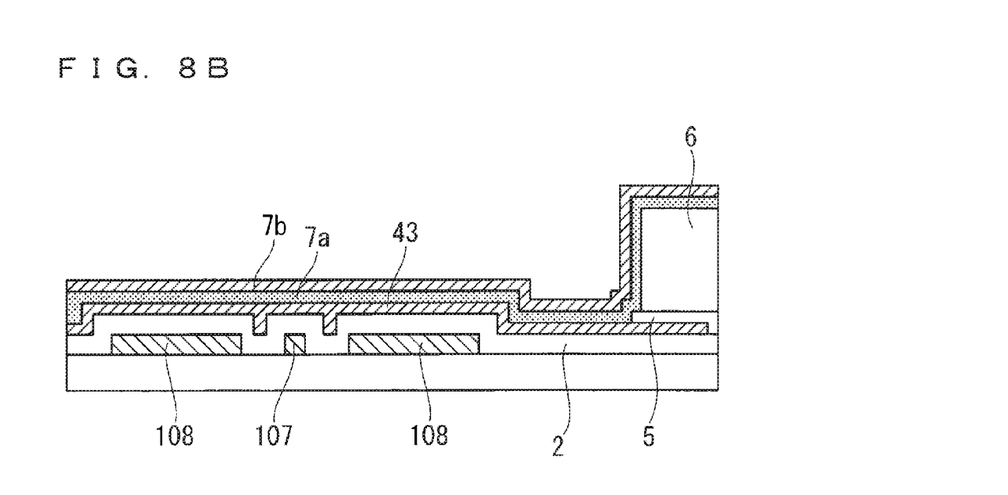

Next, as illustrated in FIGS. 8A and 8B, the first transparent conductive film 7a (transparent conductive film) and the third metal film 7b (metal film) are formed (provided) in this order on the structure formed with the process described above. IZO or ITO is used for the first transparent conductive film 7a, for example. The material for the third metal film 7b is not particularly limited. However, in the present preferred embodiment, the material same as the material of the second metal film, or the material that can be etched with the second metal film with the same etching solution is used for the third metal film 7b.

Thereafter, a photoresist is formed on the third metal film 7b, and a fifth photolithography process is performed by using a photomask, by which different portions can simultaneously be exposed with different exposure amounts, to selectively remove the photoresist and to selectively decrease the thickness of the unremoved photoresist.

For example, as illustrated in FIGS. 8A and 8B, the photoresist is removed to expose the third metal film 7b with the development at the transmission portion of the photomask used for the exposure. A photoresist PRA is hardly removed with the development but remains at the light-shielding portion (light-shielding pattern region) of the photomask. A photoresist PRB that is removed to a certain extent with the development remains at an intermediate portion (the portion exposed with an exposure amount between the amount at the transmission portion and the amount at the light-shielding portion) of the photoresist. The photoresist is completely removed in the terminal region and its peripheral region.

The thickness of the photoresist PRB can be controlled by adjusting the exposure amount corresponding to light transmittance of the photomask. A halftone mask (HT mask) or gray tone mask (GT mask) is used as the photomask, for example.

With the process described above, the structure illustrated in FIGS. 8A and 8B is obtained.

Figure 9A:
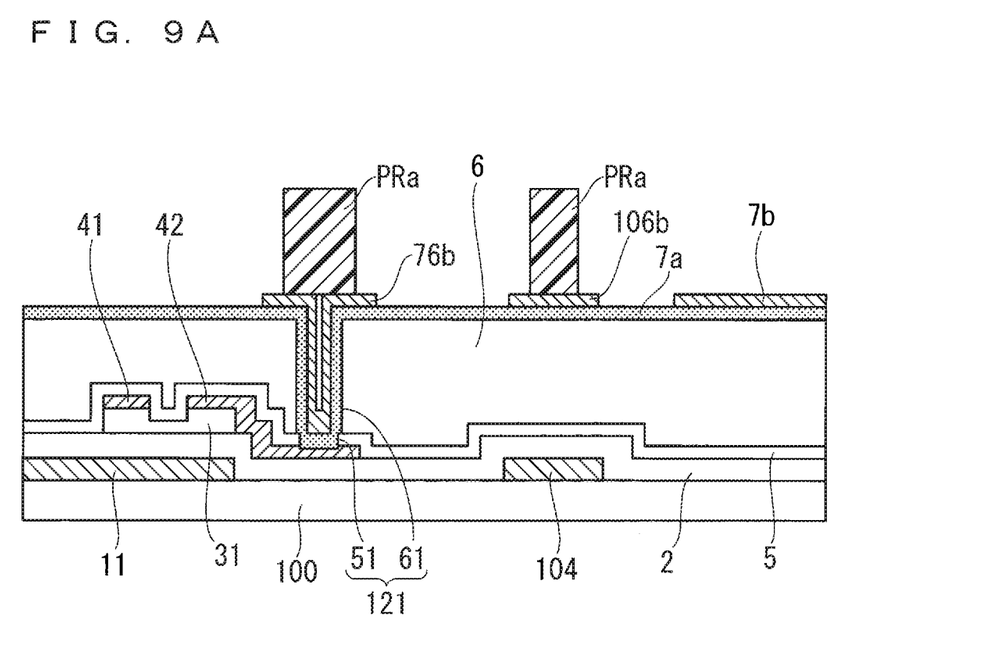
Figure 9B:
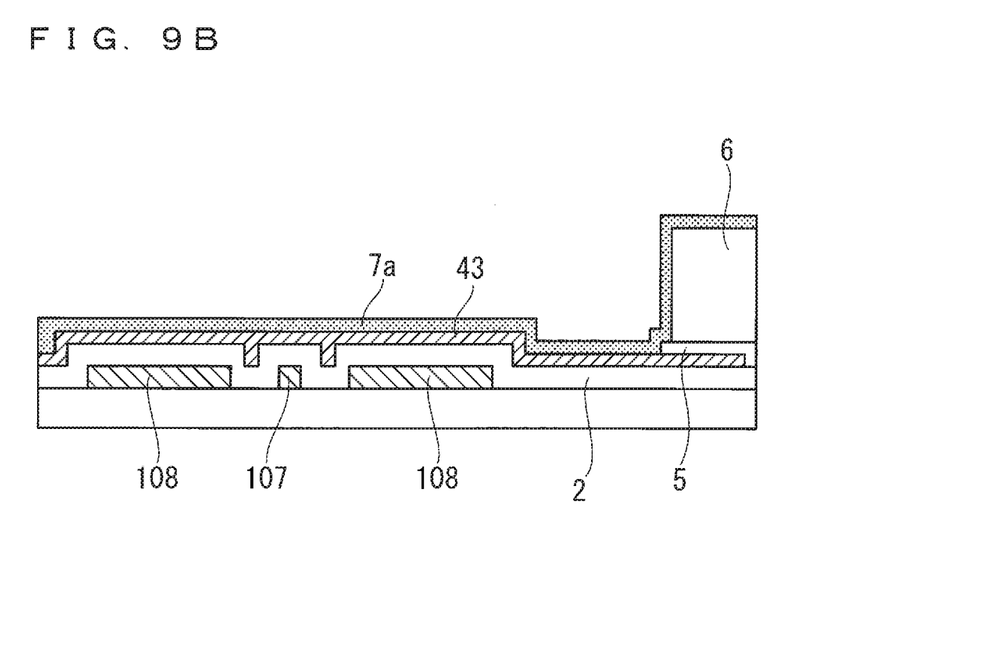

Next, the third metal film 7b is selectively etched by using the photoresists PRA and PRB as an etching mask. With this, as illustrated in FIG. 9A, the connection metal film 76b, the common metal line 106b, and the remaining third metal film 7b are formed in the display region 101. The third metal film 7b is completely removed in the terminal region and its peripheral region as illustrated in FIG. 9B. Thereafter, oxygen ashing is performed with its processing time appropriately adjusted. With this, a part of the thick photoresist PRA is left as a photoresist PRa, and the thin photoresist PRB is completely removed.

With the process described above, the structure illustrated in FIGS. 9A and 9B is obtained.

Figure 10A:
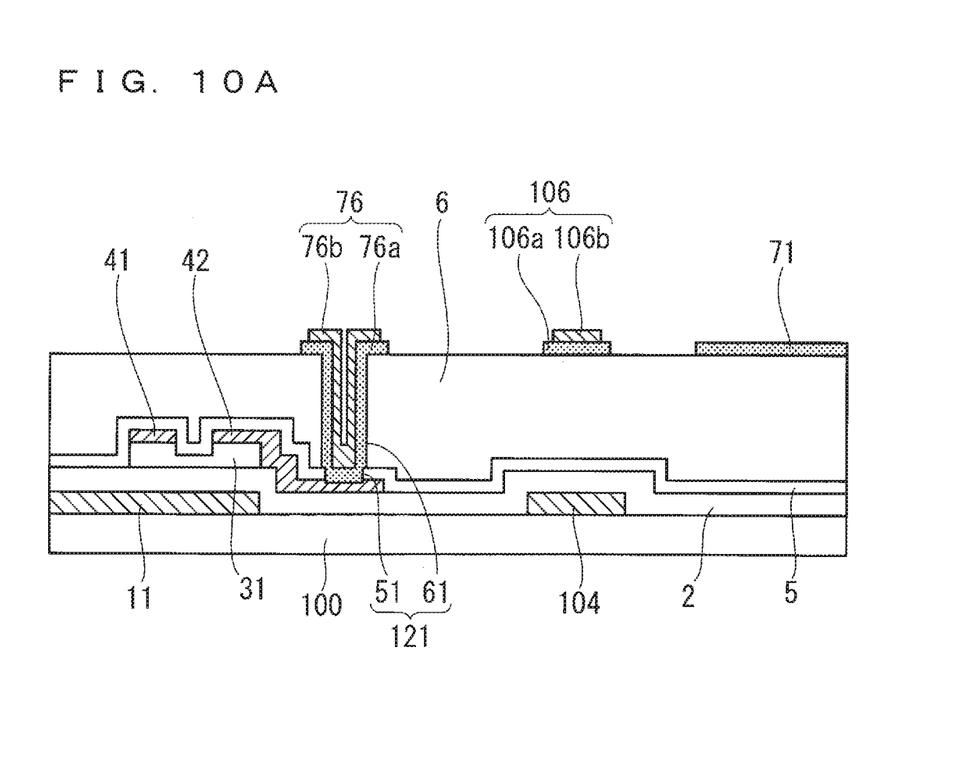
Figure 10B:
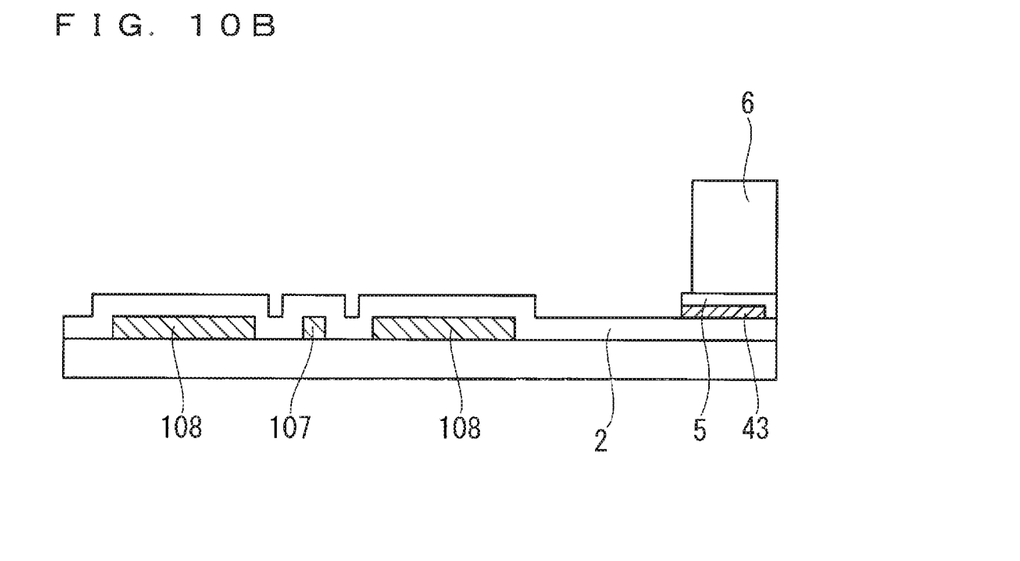

Next, the first transparent conductive film 7a is selectively etched by using the remaining third metal film 7b and the like as an etching mask. With this process, the pixel electrode 71, the connection transparent conductive film 76a, and the common transparent conductive film 106a are formed from the first transparent conductive film 7a in the display region 101 as illustrated in FIG. 10A. The first transparent conductive film 7a is completely removed in the terminal region and its peripheral region as illustrated in FIG. 10B.

Next, the remaining third metal film 7b on the pixel electrode 71 is selectively etched by using the photoresist PRa as an etching mask. With this process, the pixel electrode 71 is exposed in the display region 101 as illustrated in FIG. 10A.

For example, the material same as the material of the second metal film, or the material that can be etched with the second metal film with the same etching solution is used for the third metal film 7b as described above. Therefore, as illustrated in FIGS. 10A and 10B, the stopper metal film 43 made of the second metal film is also removed in the terminal region and the region of its peripheral region where the flattened film 6 is not formed.

Specifically, in the structure illustrated in FIGS. 8A and 8B, both of the first transparent conductive film 7a and the third metal film 7b are removed on the portion where the photoresist is removed, the third metal 7b is removed with the first transparent conductive film 7a being left on the portion where the thin photoresist PRB is formed, and both of the first transparent conductive film 7a and the third metal film 7b are left on the portion where the thick photoresist PRA is formed. With this, the pixel electrode 71 having the connection portion 76 (the connection transparent conductive film 76a and the connection metal film 76b) and the common line 106 (the common transparent conductive film 106a and the common metal line 106b) are formed. The process described here includes the process of removing both the first transparent conductive film 7a and the third metal film 7b in the frame region 102 and the process of removing the stopper metal film 43 in the frame region 102.

With the process described above, the structure illustrated in FIGS. 10A and 10B is obtained.

Figure 11A:
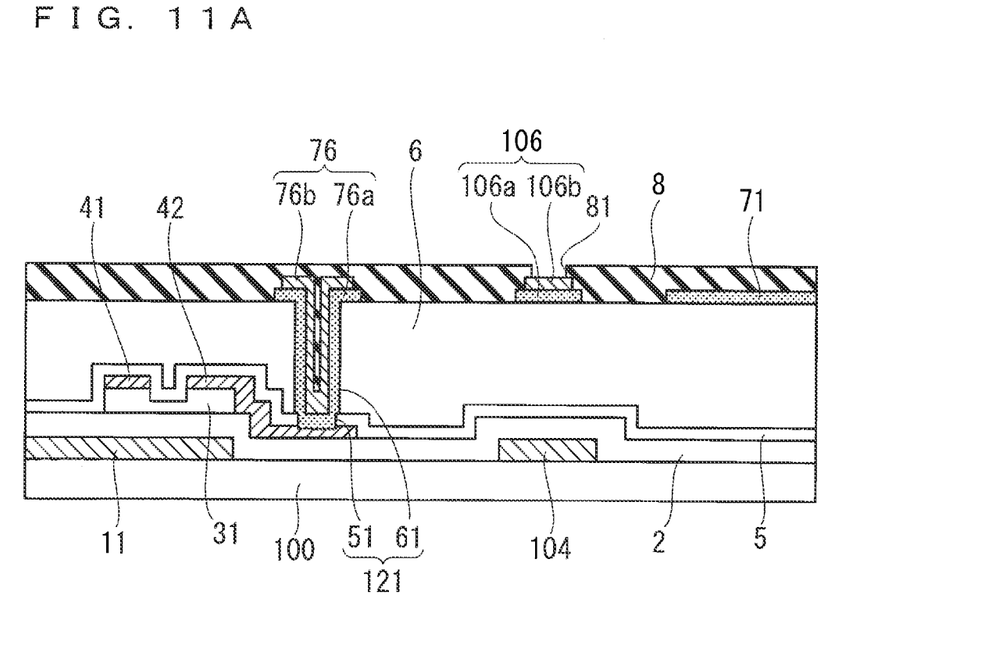
Figure 11B:
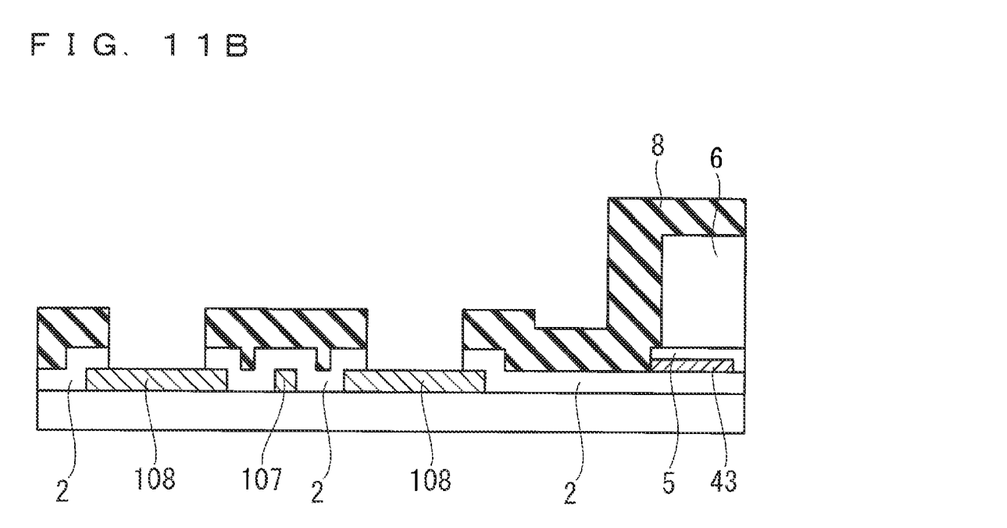

Next, the interlayer insulating film 8 is formed on the structure obtained by the above process with the plasma CVD method. An SiN film is used for the interlayer insulating film 8, for example. Then, the interlayer insulating film 8 is patterned with a sixth photolithography process and a dry etching. With this process, the interlayer insulating film 8 having the contact hole 81 formed thereon is formed in the display region 101 as illustrated in FIG. 11A. In the terminal region, the interlayer insulating film 8 and the gate insulating film 2 on the terminal electrode 108 are removed to expose the surface of the terminal electrode 108 as illustrated in FIG. 11B.

With the process described above, the structure illustrated in FIGS. 11A and 11B is obtained.

Thereafter, the second transparent conductive film is formed on the structure obtained by the above process with the sputtering method. This second transparent conductive film is also formed inside of the contact hole 81. IZO or ITO is used for the second transparent conductive film, for example. Then, the second transparent conductive film is patterned into a desired shape with a seventh photolithography process and an etching. With this process, the common electrode 91 is formed from the second transparent conductive film in the display region 101 as illustrated in FIG. 3. The terminal transparent conductive film 92 is formed from the second transparent conductive film in the terminal region as illustrated in FIG. 4.

<Conclusion>

According to the liquid crystal display panel of the present preferred embodiment described above, the connection portion 76 electrically connected to the drain electrode 42 of the thin-film transistor 105 includes the connection metal film 76b. This configuration can reduce resistance of the connection portion 76, thereby being capable of preventing an occurrence of a display defect. This configuration can also reduce the size of the contact hole 121. Therefore, the decrease in the ratio of the non-pixel display region to the pixel display region and high definition of a display can be expected. In addition, the common line 106 includes the common metal line 106b. This configuration can reduce the resistance of the common metal line 106, similar to the connection portion 76, thereby being capable of implementing uniform voltage application to the whole display region 101. This results in the suppression of the occurrence of a display defect.

According to the present preferred embodiment, the common line 106 is disposed as overlapped with the scanning line 104 in a plan view. With this configuration, the further decrease in the ratio of the non-pixel display region and higher definition of a display can be expected. The connection portion 76 and the common line 106 are made of the similar material, and are disposed on the same layer. With this, the number of photolithography processes for forming these elements can be reduced (for example, only one photolithography is enough).

For reducing the number of photolithography processes, it is considered that the common electrode 91 and the common line 106 are disposed on the same layer. However, when the common line 106 has a stacked structure, the common line 106 becomes relatively high to form a step. This step is reflected on an orientation film formed on the common line 106, and this induces rubbing defect of the orientation film. Accordingly, a display defect is considered to be caused. In addition, the common electrode 91 has slits 91a (FIG. 2). Therefore, it is difficult to perform a dimensional control with an exposure of the pattern of the slits 91a with a halftone transmittance. Therefore, the common electrode 91 and the common line 106 (common metal line 106b) have to inevitably be formed with different photolithography processes, which might increase the number of processes. On the contrary, the liquid crystal display panel according to the present preferred embodiment is not considered to entail such problem, since the connection portion 76 and the common line 106 are disposed on the same layer.

According to the present preferred embodiment, the common transparent conductive film 106a is disposed between the common metal line 106b and the flattened film made of an organic resin. This configuration eliminates the need of a measure against poor adhesiveness between the metal member and the flattened film 6 made of an organic resin, and also reduces a load to the production process. Accordingly, this configuration can suppress an adverse influence to a yield and reliability caused by a peel of elements due to poor adhesiveness.

According to the present embodiment, the common line 106 that is formed by stacking the common transparent conductive film 106a and the common metal line 106b, which are two types of materials having different oxidation-reduction potential, is disposed below the interlayer insulating film 8 and covered by the interlayer insulating film 8. With this configuration, the common line 106 is not exposed as the surface of the glass substrate 100 at the side where the liquid crystal layer is disposed. Accordingly, this configuration can suppress a battery reaction in the liquid crystal layer and a defect of burning caused by the battery reaction.

In addition, in the present preferred embodiment, the connection transparent conductive film 76a is disposed between the connection metal film 76b and the flattened film made of an organic resin. Therefore, this configuration can suppress an adverse influence to a yield and reliability caused by a peel of elements, similar to the above configuration.

In the liquid crystal display panel according to the present preferred embodiment, the flattened film 6 is not formed above the external line 107 (wiring) in the frame region 102 (the terminal region and its peripheral region). This can prevent a step on the surface around the terminal electrode 108 in the frame region 102. With this configuration, conductive particles such as bumps or ACF can easily be pressure-bonded to the surface of the terminal electrode 108, whereby conductive defect between the external line 107 and the IC chip 109 or the print substrate 110 can be prevented. As a result, a yield and reliability can be enhanced, or the space between the terminal electrodes 108 can be reduced.

<Other Modifications>

In the above preferred embodiment, the lower electrode is the pixel electrode 71, and the upper electrode is the common electrode 91. However, the present invention is not limited thereto. The lower electrode including the flat-plate electrode portion may be a common electrode, and the upper electrode having a plurality of slit-like openings may be a pixel electrode. In such configuration, it is unnecessary to form an independent transparent conductive film line, and the metal line may be formed on the common electrode to be in contact with the common electrode. In the configuration described above, the pixel electrode serving as an upper electrode is connected to the drain electrode 42 of the thin-film transistor 105 via the contact holes 81, 61, and 51 of the interlayer insulating film 8, the flattened film 6, and the protection insulating film 5.

In the preferred embodiment described above, all of the plurality of slits 91a formed on the upper electrode (common electrode 91) tilt in the same direction are provided in one pixel as illustrated in the plan view of FIG. 2, and the slit-like openings substantially fall within the range of the pixel display region 151. However, the configuration is not limited thereto. The shape of each slit 91a may be changed, as necessary, according to a purpose. For example, as a structure for suppressing an occurrence of a color shift phenomenon that is a coloring of an image visually recognized depending on a direction from which an image display is observed, one pixel may be split into an upper half region and a lower half region in the vertical direction, and two types of slit-like openings whose tilt directions are symmetrically different with respect to the boundary line (split line) of these regions may be formed. Alternatively, in one pixel, slit-like openings tilting in the same direction may be formed as in the above preferred embodiment, and a plurality of pixels may be arrayed such that a pixel having one of the above two-types of slit-like openings and a pixel having the other one are alternately arrayed in a column direction and a row direction. As a structure for suppressing an occurrence of disclination around the end of the slit 91a, the tilt direction of the slit 91a only at its tip end may be changed by bending the slit 91a around the end of the slit-like opening. Alternatively, the end of the slit 91a may be overlapped with the signal line 103 in a plan view.

Figure 12:
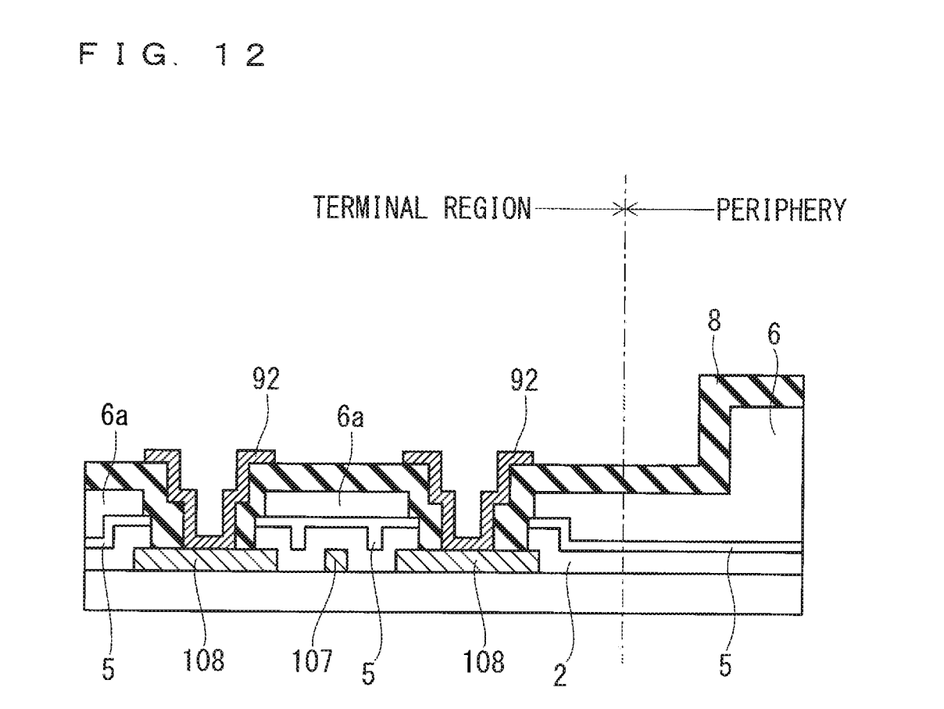
FIG. 12 is a sectional view illustrating a configuration of a part of a liquid crystal display panel according to a modification.

Alternatively, a flattened film 6a may be left for preventing damage, caused by an external contact, on the external line 107 in the frame region 102 (the terminal region and its peripheral region). As one example of this configuration, a flattened film 6a thinner than the flattened film 6 in the display region 101 may be formed above the line (external line 107) in the frame region 102 (the terminal region and its peripheral region) as illustrated in FIG. 12. The thickness of the flattened film 6a can be controlled by adjusting an exposure amount corresponding to light transmittance of a used photomask such as an HT mask or a GT mask.

The configuration in which the thin flattened film 6a is formed can prevent a step on the surface around the terminal electrode 108, as in the above preferred embodiment. As a result, a yield and reliability can be enhanced, or the space between the terminal electrodes 108 can be reduced. Notably, as illustrated in FIG. 12, the fattened film 6 is preferably covered by the interlayer insulating film 8 so as to prevent the flattened film 6 from being floated or peeled at the interface with the protection insulating film 5.

While the invention has been shown and described in detail, the foregoing description is in all aspects illustrative and not restrictive. It is therefore understood that numerous modifications and variations can be devised without departing from the scope of the invention.

What is claimed is:

1. A liquid crystal display panel comprising:
   a thin-film transistor electrically connected to lines including a scanning line;
   a flattened film formed on said thin-film transistor, having a flattened top surface, and having a contact hole formed thereon;
   a lower electrode formed on said top surface of said flattened film;

an insulating film formed on a top surface of said lower electrode;

an upper electrode disposed on a top surface of said insulating film, and made of a transparent conductive film having a plurality of slit-like openings formed thereon, the upper electrode being capable of generating an electric field for driving liquid crystal with said lower electrode; and a common line disposed on said top surface of said flattened film as overlapped with said scanning line in a plan view, and electrically connected to said upper electrode, wherein said common line includes a metal line, said lower electrode includes:

a flat-plate electrode portion disposed on said top surface of said flattened film and made of a transparent conductive film; and a connection portion formed in said contact hole of said flattened film and electrically connected to said thin-film transistor, said common line is disposed below said insulating film and covered by the insulating film said upper electrode is electrically connected to said common line via an insulating film contact hole being a contact hole formed on said insulating film, and said insulating film contact hole in a plan view is disposed on a part of a region in which said scanning line is disposed, said part not overlapping said thin film transistor.

2. The liquid crystal display panel according to claim 1, wherein said flattened film is made of an organic resin, and said common line further includes:

a first transparent conductive film disposed between said metal line and said flattened film, and is disposed below said insulating film and covered by the insulating film.

3. The liquid crystal display panel according to claim 1, further comprising:

a terminal electrode electrically connected to an external member in a frame region adjacent to a display region on which said thin-film transistor is disposed, wherein said thin-film transistor is electrically connected to said terminal electrode via said lines, and above said lines in said frame region, said flattened film is not formed, or a flattened film thinner than said flattened film in said display region is formed.

4. The liquid crystal display panel according to claim 1, wherein said connection portion of said lower electrode includes a metal member made of a material being the same as a material of said metal line of said common line, said metal member not being a transparent conductive film.

5. A liquid crystal display panel comprising:

a thin film transistor electrically connected to lines including a scanning line;

a flattened film formed on said thin-film transistor, having a flattened top surface, and having a contact hole formed thereon;

a lower electrode disposed on said top surface of said flattened film;

an insulating film disposed on a top surface of said lower electrode;

an upper electrode disposed on a top surface of said insulating film, and made of a transparent conductive film having a plurality of slit-like openings formed thereon, the upper electrode being capable of generating an electric field for driving liquid crystal with said lower electrode; and a common line disposed on said top surface of said flattened film as overlapped with said scanning line in a plan view, and electrically connected to one of said lower electrode and said upper electrode, wherein said common line includes a metal line, the other one of said lower electrode and said upper electrode includes:

a flat-plate electrode portion disposed on said top surface of said flattened film and made of a transparent conductive film; and a connection portion formed in said contact hole of said flattened film and electrically connected to said thin-film transistor, said connection portion of said lower electrode includes a metal member made of a material being the same as a material of said metal line of said common line, said metal member not being a transparent conductive film, said flattened film is made of an organic resin, and said connection portion of said lower electrode further includes:

a second transparent conductive film disposed between said metal member and said flattened film.

6. The liquid crystal display panel according to claim 5, wherein said flattened film is made of an organic resin, and said common line further includes a first transparent conductive film disposed between said metal line and said flattened film, and is disposed below said insulating film and covered by the insulating film.

7. The liquid crystal display panel according to claim 5, further comprising:

a terminal electrode electrically connected to an external member in a frame region adjacent to a display region on which said thin-film transistor is disposed, wherein said thin-film transistor is electrically connected to said terminal electrode via said lines, and above said lines in said frame region, said flattened film is not formed, or a flattened film thinner than said flattened film in said display region is formed.

8. The liquid crystal display panel according to claim 5, wherein said lower electrode includes said connecting portion, and said second transparent conductive film and a pixel electrode are formed from a single-layer contiguous transparent conductive film pattern.

* * * * *